United States Patent
Ramesh

(10) Patent No.: US 11,579,843 B2
(45) Date of Patent: Feb. 14, 2023

(54) BIT STRING ACCUMULATION IN MULTIPLE REGISTERS

(71) Applicant: Micron Technology, Inc., Boise, ID (US)

(72) Inventor: Vijay S. Ramesh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 313 days.

(21) Appl. No.: 16/901,646

(22) Filed: Jun. 15, 2020

(65) Prior Publication Data

US 2021/0389930 A1    Dec. 16, 2021

(51) Int. Cl.
   *G06F 7/544*    (2006.01)
   *G11C 7/06*    (2006.01)
(52) U.S. Cl.
   CPC .............. *G06F 7/5443* (2013.01); *G11C 7/06* (2013.01)
(58) Field of Classification Search
   CPC ................................ G11C 7/06; G06F 7/5443
   See application file for complete search history.

(56) References Cited

U.S. PATENT DOCUMENTS

| 4,758,972 A | 7/1988 | Frazier |
| 7,865,541 B1 | 1/2011 | Langhammer |
| 8,214,417 B2 | 7/2012 | Ahmed |
| 2016/0283240 A1* | 9/2016 | Mishra ................ G06F 9/30018 |
| 2018/0129935 A1* | 5/2018 | Kim ........................ G06N 3/082 |

OTHER PUBLICATIONS

Gustafson, et al. "Beating Floating Point at its Own Game: Posit Arithmetic", Jan. 2017, retrieved from <http://www.johngustafson.net/pdfs/BeatingFloatingPoint.pdf>, 16 pages.

* cited by examiner

*Primary Examiner* — Zachary K Huson
(74) *Attorney, Agent, or Firm* — Brooks, Cameron & Huebsch, PLLC

(57) ABSTRACT

Methods, Systems, and apparatuses related to performing bit string accumulation within a compute or memory device are described. A logic circuit with processing capability and a register within or near memory, for example, can perform multiple iterations of a recursive operation using several bit strings. Results of the various iterations may be written to the register, and subsequent iterations of the recursive operation using the bit strings may be performed. Results of the iterations of recursive operations may be accumulated within the register. Accumulated results may be written as data to another register or to memory that is external to or separate from the logic circuit.

17 Claims, 6 Drawing Sheets

BIT STRING ACCUMULATION IN MULTIPLE REGISTERS

TECHNICAL FIELD

The present disclosure relates generally to semiconductor memory and methods, and more particularly, to apparatuses, systems, and methods for bit string accumulation in multiple registers.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
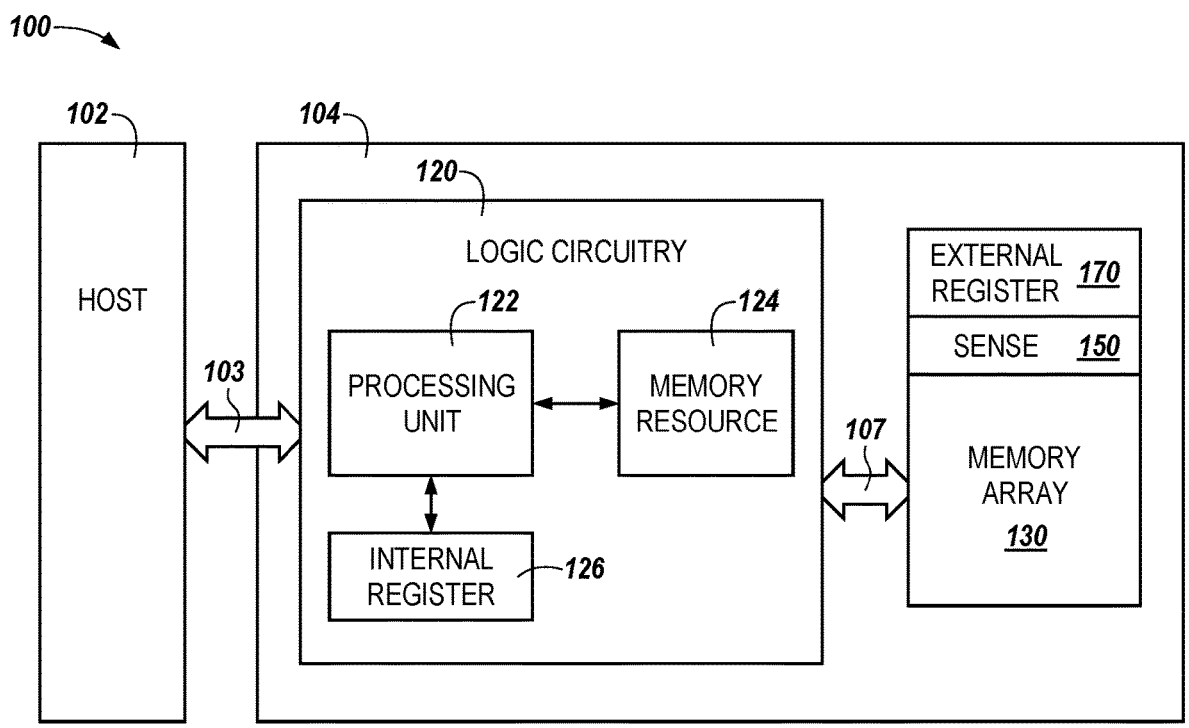
FIG. 1 is a functional block diagram in the form of an apparatus including a host and a memory device in accordance with a number of embodiments of the present disclosure.

Methods, Systems, and apparatuses related to performing bit string accumulation within a compute or memory device are described. A logic circuit with processing capability and a register within or near memory, for example, can perform multiple iterations of a recursive operation using several bit strings. Results of the various iterations may be written to the register, and subsequent iterations of the recursive operation using the bit strings may be performed. Results of the iterations of recursive operations may be accumulated within the register. Accumulated results may be written as data to another register or to memory that is external to or separate from the logic circuit.

Computing systems can be used to perform a wide of range of operations using data such as bit strings, which can be processed by the computing system to facilitate operation of the computing system, as well as to perform computations using the data. Such operations can involve large sets of data and/or large bit strings and can therefore require vast computing resources (e.g., processing and/or memory resources) in their performance. Some examples of operations that can be performed using a computing system can include arithmetic operations, logical operations, bit-wise operations, vector operations, and/or dot product operations, as well as recursive operations, such as accumulate operations, multiply-accumulate (MAC) operations, fused-multiply add (FMA) operations, and/or fused multiply-accumulate (FMAC) operations, among others.

However, computing systems have a finite amount of memory in which to store operands on which calculations are to be performed. In order to facilitate performance of operation on operands stored by a computing system within the constraints imposed by finite memory resources, operands can be stored in particular formats. One such format is referred to as the "floating-point" format, or "float," for simplicity (e.g., the IEEE 754 floating-point format).

Under the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., +∞ and −∞) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

An alternative format to floating-point is referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the mantissa to indicate whether a real number is an exact float, or if it lies in the interval between adjacent floats. The sign, exponent, and mantissa bits in a Type I unum take their definition from the IEEE 754 floating-point format, however, the length of the exponent and mantissa fields of Type I unums can vary dramatically, from a single bit to a maximum user-definable length. By taking the sign, exponent, and mantissa bits from the IEEE 754 standard floating-point format, Type I unums can behave similar to floating-point numbers, however, the variable bit length exhibited in the exponent and fraction bits of the Type I unum can require additional management in comparison to floats.

Type II unums are generally incompatible with floats, however, Type II unums can permit a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. As a result, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for higher precision (e.g., a broader dynamic range, higher resolution, and/or higher accuracy) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations thereby reducing processing time and/or power consumed in performing such operations. In addition, the use of posits in computing systems can allow for higher accuracy and/or precision in computations than floating-point numbers, which can further improve the functioning of a computing system in comparison to some approaches (e.g., approaches which rely upon floating-point format bit strings).

Posits can be highly variable in precision and accuracy based on the total quantity of bits and/or the quantity of sets of integers or sets of bits included in the posit. In addition, posits can generate a wide dynamic range. The accuracy, precision, and/or the dynamic range of a posit can be greater than that of a float, or other numerical formats, under certain conditions, as described in more detail herein. The variable accuracy, precision, and/or dynamic range of a posit can be manipulated, for example, based on an application in which a posit will be used. In addition, posits can reduce or eliminate the overflow, underflow, NaN, and/or other corner cases that are associated with floats and other numerical formats. Further, the use of posits can allow for a numerical value (e.g., a number) to be represented using fewer bits in comparison to floats or other numerical formats.

These features can, in some embodiments, allow for posits to be highly reconfigurable, which can provide improved application performance in comparison to approaches that rely on floats or other numerical formats. In addition, these features of posits can provide improved performance in machine learning applications in comparison to floats or other numerical formats. For example, posits can be used in machine learning applications, in which computational performance is paramount, to train a network (e.g., a neural network) with a same or greater accuracy and/or precision than floats or other numerical formats using fewer bits than floats or other numerical formats. In addition, inference operations in machine learning contexts can be achieved using posits with fewer bits (e.g., a smaller bit width) than floats or other numerical formats. By using fewer bits to achieve a same or enhanced outcome in comparison to floats or other numerical formats, the use of posits can therefore reduce an amount of time in performing operations and/or reduce the amount of memory space required in applications, which can improve the overall function of a computing system in which posits are employed.

Some embodiments herein are directed to performance of recursive operations using universal number or posit bit strings as operands and selectively storing results of iterations of the recursive operations in special purpose registers, as described below. As used herein, a "recursive operation" generally refers to an operation that is performed a specified quantity of times where a result of a previous iteration of the recursive operation is used an operand for a subsequent iteration of the operation. For example, a recursive multiplication operation can be an operation in which two bit string operands, β and φ are multiplied together and the result of each iteration of the recursive operation is used as a bit string operand for a subsequent iteration. Stated alternatively, a recursive operation can refer to an operation in which a first iteration of the recursive operation includes multiplying β and φ together to arrive at a result λ (e.g., β×φ=λ). The next iteration of this example recursive operation can include multiplying the result λ by φ to arrive at another result ω (e.g., λ×φ=ω).

Another illustrative example of a recursive operation can be explained in terms of calculating the factorial of a natural number. This example, which is given by Equation 1 can include performing recursive operations when the factorial of a given number, n, is greater than zero and returning unity if the number n is equal to zero:

$$\text{fact}(n) = \begin{cases} 1 & \text{if } n = 0 \\ n \times \text{fact}(n-1) & \text{if } n > 0 \end{cases} \quad \text{Equation 1}$$

As shown in Equation 1, a recursive operation to determine the factorial of the number n can be carried out until n is equal to zero, at which point the solution is reached and the recursive operation is terminated. For example, using Equation 1, the factorial of the number n can be calculated recursively by performing the following operations: n×(n−1)×(n−2)× . . . ×1.

Yet another example of a recursive operation is a multiply-accumulate operation in which an accumulator, a is modified at iteration according to the equation a←a+(b×c). In a multiply-accumulate operation, each previous iteration of the accumulator a is summed with the multiplicative product of two operands b and c.

Due to their nature, the size of a result of each iteration of a recursive operation can be larger than the result of a previous iteration. As a result, in some approaches, performance of recursive operations, especially those that are performed for a large number of iterations (e.g., millions or billions of iterations) can require a large amount of memory resources to store accurate results of the operation. In order to reduce the amount of memory resources, computation time, processing resources, and/or processing time that can be required to store accurate results of a recursive operation, some approaches allow for recursive operations to be performed with one or more roundings (e.g., a may be truncated at one or more iterations of the operation). Although such approaches can reduce the amount of memory resources that may be demanded for such operations, by rounding results of iterations of the recursive operation, the inaccuracies introduced by such roundings can be propagated through the operation thereby creating a more pronounced effect in the accuracy of a final result of the recursive operation.

Further, in approaches in which the results of iterations are rounded during performance of a recursive operation, the amount by which the results of the iterations are rounded may not be taken into account. For example, in some approaches, the portion of the result of the iterations (or final result) of the recursive operation that are removed during the rounding can be discarded, thereby making it impossible to recover accuracy and/or precision of the recursive operation that is lost during rounding.

Some approaches provide a small cache or set of registers (e.g., a hidden scratch area) for temporary calculations, such as intermediate results of recursive operations. However, in such approaches, these registers or cache(s) may not be large enough to support storage of exact results of intermediate recursive large bit string operations (e.g., operations using 32-bit or 64-bit bit string operands) without incurring rounding errors due to the size constraints of the registers or cache(s). Even when using smaller vectors for recursive operations (e.g., 8-bit or 16-bit bit string operands), the registers or cache(s) may become overrun depending on the number of iterations used in the recursive operation.

In some approaches, the small cache or set of registers (e.g., the hidden scratch area) can be "hidden" (e.g., not accessible by a user). In contrast, in some embodiments, access to the peripheral circuitry of the memory device (e.g., the special purpose registers described herein) can be provided to a user of the computing system in which the memory device is operating. For example, a user may be provided with the ability to control access to the peripheral circuitry, which can allow for greater control of operations that take advantage of the peripheral circuitry, such as recursive operations. This can allow for greater control of what types of operations are allowed to utilize the peripheral circuitry, can allow for greater control over when recursive operations are terminated, and/or greater control over when a resultant bit string stored in the peripheral circuitry is truncated.

In contrast, embodiments herein are directed to special purpose registers to accumulate results of intermediate iterations of recursive operations during performance of a recursive operation. One such register (e.g., an "external register") can be provided in a periphery location of a memory array and another such register (e.g., an "internal register") can be provided within, or tightly coupled to, hardware circuitry (e.g., logic circuitry) that is used to perform the recursive operation. In some embodiments, the internal register and/or the external register can be provided as "quire registers," as discussed in connection with FIGS. 1 and 2, herein. Further, as described in more detail herein, the internal register and the external register can have different sizes associated therewith. For example, the internal register can include fewer storage locations than the external register, or vice versa.

In some embodiments, the hardware circuitry can cause a recursive operation to be performed using bit string operands and accumulate the results of iterations of the recursive operations in the special purpose register(s) that is deployed within the hardware circuitry (e.g., within the "internal register(s)"). The hardware circuitry can, after a particular quantity of iterations of the recursive operation is performed, that a subsequent iteration of the recursive operation will overrun the internal register and cause the result stored in the internal register to be transferred to the external register. This can allow for an accuracy or precision of the accumulated result to be maintained while subsequent iterations of the recursive operation are performed.

Once the recursive operation is complete, the accumulated results stored in the internal register and in the external register can be used to recover a final result of the recursive operation. In some embodiments, because the accumulated results are not truncated during performance of the recursive operation (e.g., because the entire accumulated result is stored in the internal register and/or the external register), the final result of recursive operation can have a greater accuracy or precision than in approaches in which the results of one or more iterations of the recursive operation are rounded or truncated during performance of the recursive operation.

In other embodiments, the hardware circuitry can cause a recursive operation to be performed using bit string operands and accumulate a particular quantity of results of iterations of the recursive operations in the special purpose register(s) that is deployed within the hardware circuitry (e.g., within the "internal register(s)"). For example, the hardware circuitry can cause a result of the first iteration of the recursive operation to be accumulated in the internal register and then can cause results of subsequent iterations to be accumulated in the external register.

In some embodiments, the hardware circuitry can include a plurality of multiplier-accumulate (MAC) units, as described in connection with FIG. 2, herein. Each of the MAC units may include its own dedicated internal register that can be configured to accumulate results of iterations of recursive operations performed by the MAC unit in which the internal register is deployed. In such embodiments, the hardware circuitry can cause the accumulated results of one or more of the internal registers to be transferred to the external register and/or the hardware circuitry can cause the accumulated results stored in the one or more registers to be summed together as part of performance of larger recursive operation that is performed by performing sub-operations of the recursive operation using each of the MAC units.

In embodiments described herein, the recursive operations can be performed using bit strings that are formatted in the universal number or posit format. However, because a host may provide bit strings formatted according to a floating-point or fixed-point binary format, the hardware circuitry may perform operations to convert the bit strings from the floating-point or fixed-point binary format to a universal number or posit format prior to causing the recursive operations to be performed using the bit strings as operands. By converting the bit strings to the universal number or posit format prior to performance of recursive operations, the precision and/or accuracy of the recursive operations can be improved over scenarios in which floating-point or fixed-point binary bit strings are used as operands for the recursive operations.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X," "N," "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2. A group or plurality of similar elements or components may generally be referred to herein with a single element number. For example, a plurality of reference elements 226-1 to 226-N (or, in the alternative, 226-1, . . . , 226-N) may be referred to generally as 226. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a host 102 and a memory device 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory device 104 can include a one or more memory modules (e.g., single in-line memory modules, dual in-line memory modules, etc.). The memory device 104 can include volatile memory and/or non-volatile memory. In a number of embodiments, memory device 104 can include a multi-chip device. A multi-chip device can include a number of different memory types and/or memory modules. For example, a memory system can include non-volatile or volatile memory on any type of a module. As shown in FIG. 1, the apparatus 100 can include logic circuitry 120, which can include a processing unit 122 and a memory resource 124, a memory array 130, and sensing circuitry 150 (e.g., the SENSE 150). Examples of the sensing circuitry 150 are describe in more detail in connection with FIG. 6, herein. For instance, in a number of embodiments, the sensing circuitry 150 can include a number of sense amplifiers and corresponding compute components, which may serve as an accumulator and can be used to perform logical operations using bit strings that represent the results of recursive operations performed using the logic circuitry 120 that are stored in the memory array 130. In addition, each of the components (e.g., the host 102, the logic circuitry 120, the a processing unit 122, the memory resource 124, the memory array 130, and/or the sensing circuitry 150) can be separately referred to herein as an "apparatus." The processing unit 122 may be referred to as a "processing device" herein.

The memory device 104 can provide main memory for the computing system 100 or could be used as additional memory or storage throughout the computing system 100. The memory device 104 can include one or more memory arrays 130 (e.g., arrays of memory cells), which can include volatile and/or non-volatile memory cells. The memory array 130 can be a flash array with a NAND architecture, for example. Embodiments are not limited to a particular type of memory device. For instance, the memory device 104 can include RAM, ROM, DRAM, SDRAM, PCRAM, RRAM, and flash memory, among others.

In embodiments in which the memory device 104 includes non-volatile memory, the memory device 104 can include flash memory devices such as NAND or NOR flash memory devices. Embodiments are not so limited, however, and the memory device 104 can include other non-volatile memory devices such as non-volatile random-access memory devices (e.g., NVRAM, ReRAM, FeRAM, MRAM, PCM), "emerging" memory devices such as resistance variable (e.g., 3-D Crosspoint (3D XP)) memory devices, memory devices that include an array of self-selecting memory (SSM) cells, etc., or combinations thereof. Resistance variable memory devices can perform bit storage based on a change of bulk resistance, in conjunction with a stackable cross-gridded data access array. Additionally, in contrast to many flash-based memories, resistance variable non-volatile memory can perform a write in-place operation, where a non-volatile memory cell can be programmed without the non-volatile memory cell being previously erased. In contrast to flash-based memories and resistance variable memories, self-selecting memory cells can include memory cells that have a single chalcogenide material that serves as both the switch and storage element for the memory cell.

As illustrated in FIG. 1, a host 102 can be coupled to the memory device 104. In a number of embodiments, the memory device 104 can be coupled to the host 102 via one or more channels (e.g., channel 103). In FIG. 1, the memory device 104 is coupled to the host 102 via channel 103 and logic circuitry 120 of the memory device 104 is coupled to the memory array 130 via a channel 107. The host 102 can be a host system such as a personal laptop computer, a desktop computer, a digital camera, a smart phone, a memory card reader, and/or an internet-of-things (IoT) enabled device, among various other types of hosts.

The host 102 can include a system motherboard and/or backplane and can include a memory access device, e.g., a processor (or processing device). One of ordinary skill in the art will appreciate that "a processor" can intend one or more processors, such as a parallel processing system, a number of coprocessors, etc. The system 100 can include separate integrated circuits or both the host 102, the memory device 104, and the memory array 130 can be on the same integrated circuit. The system 100 can be, for instance, a server system and/or a high-performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture.

Figure 2:
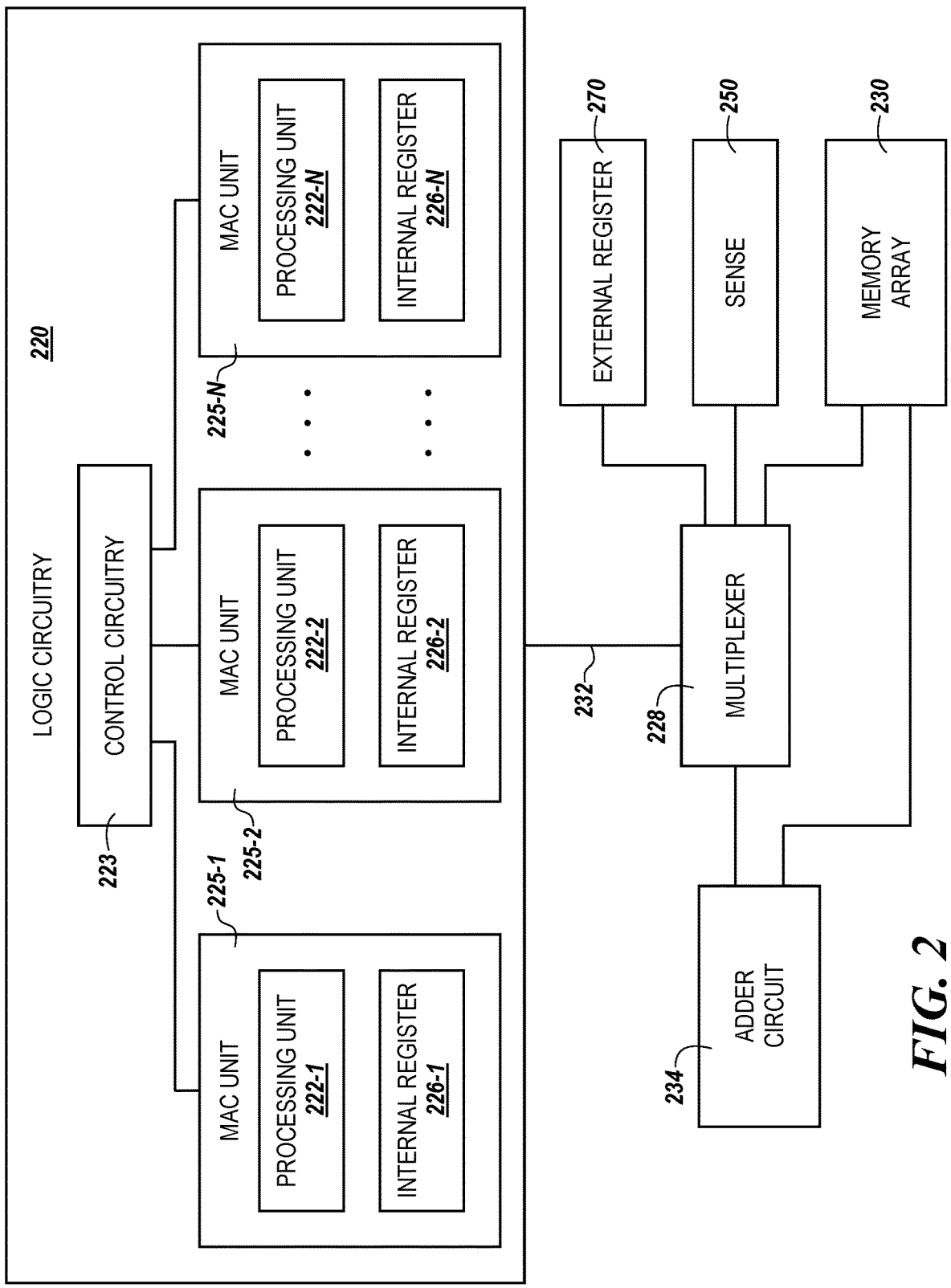
FIG. 2 is a functional block diagram in the form of logic circuitry including an apparatus including control circuitry and a plurality of multiplier-accumulate units in accordance with a number of embodiments of the present disclosure.

The memory device 104, which is shown in more detail in FIG. 2, herein, can include logic circuitry 120, which can include a processing unit 122 and a memory resource 124. The processing unit 122 can be provided in the form of an integrated circuit, such as an application-specific integrated circuit (ASIC), field programmable gate array (FPGA), reduced instruction set computing device (RISC), advanced RISC machine, system-on-a-chip, or other combination of hardware and/or circuitry that is configured to perform operations described in more detail, herein. In some embodiments, the processing unit 122 can comprise one or more processors (e.g., processing device(s), etc.).

The processing unit 122 can perform operations to control access to and from the memory array 130, the sense amps 150, and/or the external register 170. In some embodiments, the processing unit 122 can perform the operations described herein by executing instructions stored by the logic circuitry 120 (e.g., instructions stored by the memory resource 124).

For example, the processing unit 122 can perform (or, by executing instructions stored in the memory resource 124, cause performance of) recursive operations, writing of results of iterations of the recursive operations to the internal register 126, writing of results of iterations of the recursive operations to the external register 170, and/or writing of results of the recursive operations that are stored in the internal register to the external register 170. In some embodiments, the processing unit 120 can perform or cause performance of such operations in the absence of commands from circuitry external to the memory device 104 (e.g., in the absence of commands received from the host 102).

The logic circuitry 120 can further include a memory resource 124, which can be communicatively coupled to the logic circuitry 122. The memory resource 124 can include volatile memory resource, non-volatile memory resources, or a combination of volatile and non-volatile memory resources. In some embodiments, the memory resource can be a random-access memory (RAM) such as static random-access memory (SRAM). Embodiments are not so limited, however, and the memory resource can be a cache, one or more registers, NVRAM, ReRAM, FeRAM, MRAM, PCM), "emerging" memory devices such as resistance variable memory resources, phase change memory devices, memory devices that include arrays of self-selecting memory cells, etc., or combinations thereof. In some embodiments, the memory resource 124 can serve as a cache for the logic circuitry 122.

The logic circuitry 120 can further include an internal register 124, which can be communicatively coupled to the processing unit 122. The internal register 126 can be resident on the logic circuitry 120 and, therefore resident on the memory device 104. As used herein, the term "resident on" refers to something that is physically located on a particular component. For example, the internal register 126 being "resident on" the logic circuitry 120 and/or the memory device 104 refers to a condition in which the hardware circuitry that comprises the internal register 126 is physically located on the logic circuitry 120 and/or the memory device 104. The term "resident on" may be used interchangeably with other terms such as "deployed on" or "located on," herein.

The internal register 126 can be provided in the form of a quire register, which can have a fixed or variable quantity of storage location associated therewith. For example, the internal register 126 can include any desired quantity of storage locations (e.g., 8-bits, 14-bits, 32-bits, 64-bits, 2,016-bits, etc.) to accommodate results of iterations of the recursive operation and/or an additional storage location to store a sign bit corresponding to a bit string stored therein. However, in at least one embodiment, the internal register 126 contains a variable amount of storage locations such that bit strings having 64-bits to 4,032-bits can be stored therein.

As shown in FIG. 1, sensing circuitry 150 is coupled to a memory array 130 and the logic circuitry 120. The sensing circuitry 150 can include one or more sense amplifiers and one or more compute components. The sensing circuitry 150 can provide additional storage space for the memory array 130 and can sense (e.g., read, store, cache) data values that are present in the memory device 104. In some embodiments, the sensing circuitry 150 can be located in a periphery area of the memory device 104. For example, the sensing circuitry 150 can be located in an area of the memory device 104 that is physically distinct from the memory array 130. The sensing circuitry 150 can include sense amplifiers, latches, flip-flops, etc. that can be configured to stored data values, as described herein. In some embodiments, the sensing circuitry 150 can be provided in the form of a register or series of registers and can include a same quantity of storage locations (e.g., sense amplifiers, latches, etc.) as there are rows or columns of the memory array 130. For example, if the memory array 130 contains around 16K rows or columns, the sensing circuitry 150 can include around 16K storage locations. Accordingly, in some embodiments, the sensing circuitry 150 can be a register that is configured to hold up to 16K data values, although embodiments are not so limited.

An external register 170 can be coupled to the memory array 130, the sensing circuitry 150, and/or the logic circuitry 120. The external register 170 can include periphery sense amplifiers can provide additional storage space for the memory array 130 and can sense (e.g., read, store, cache) data values that are present in the memory device 104. In some embodiments, the external register 170 can be located in a periphery area of the memory device 104. For example, the external register 170 can be located in an area of the memory device 104 that is physically distinct from the memory array 130. The external register 170 can include sense amplifiers, latches, flip-flops, etc. that can be configured to stored data values, as described herein. In some embodiments, the external register 170 can be provided in the form of a single register or series of registers and can include a same quantity of storage locations (e.g., sense amplifiers, latches, etc.) as there are rows or columns of the memory array 130. For example, if the memory array 130 contains around 16K rows or columns, the external register 170 can include around 16K storage locations.

The embodiment of FIG. 1 can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 104 and/or the memory array 130. It will be appreciated by those skilled in the art that the number of address input connections can depend on the density and architecture of the memory device 104 and/or the memory array 130.

FIG. 2 is a functional block diagram in the form of logic circuitry 220 including an apparatus including control circuitry 223 and a plurality of multiplier-accumulate units 225-1 to 225-N in accordance with a number of embodiments of the present disclosure. The logic circuitry 220 can be analogous to the logic circuitry 120 illustrated in FIG. 1, while the memory array 230, the sensing circuitry ("SENSE") 250, and the external registers 270 can be analogous to the memory array 130, the sensing circuitry ("SENSE") 150, and the external registers 170 illustrated in FIG. 1, respectively.

As shown in FIG. 2, the logic circuitry 220 can further include control circuitry 223 and a plurality of multiplier-accumulate (MAC) units 225-1 to 225-N. The MAC units 225-1 to 225-N can each include a respective processing unit 222 and internal register 226. For example, the MAC unit 225-1 can include a processing unit 222-1 and an internal register 226-1, the MAC unit 225-2 can include a processing unit 222-2 and an internal register 226-2, and the MAC unit 225-N can include a processing unit 222-N and an internal register 226-N. In some embodiments, the processing units 222-1 to 222-N and internal registers 226-1 to 226-N can be analogous to the processing unit 122 and the internal register 126 illustrated in FIG. 1, respectively.

The control circuitry 223 can, for example, be a state machine (e.g., a finite state machine), hardware logic, a field-programmable gate array, or other circuitry that can be configured to perform operations and/or execute machine-readable instructions to control operation of the MAC units 225-1 to 225-N. For example, the control circuitry 223 can orchestrate performance of recursive operations performed by the MAC units 225-1 to 225-N and/or orchestrate writing of the results of iterations of the recursive operations to the internal registers 226-1 to 226-N, the external register 270, the sensing circuitry 250, and/or the memory array 230.

The logic circuitry 220 can be coupled via a communication path 232 to a multiplexer 228. The communication path 232 can be a bus, interface, or other path suitable for transferring of data and/or signals to and from the logic circuitry 220 to circuitry external to the logic circuitry 220. In some embodiments, the communication path 232 can transfer 256 bits of data at a time, although embodiments are not limited to this specific example.

The multiplexer 234 can be coupled to an adder circuit 234, the external register 270, the sensing circuitry 250, and/or the memory array 230. In some embodiments, the multiplexer can be controlled (e.g., by signals asserted by the logic circuitry 220, the control circuitry 223, etc. via the communication path 232) to transfer data accumulated in the internal registers 226-1 to 226-N to the adder circuit 234, the external register 270, the sensing circuitry 250, and/or the memory array 230.

The adder circuit 234 can be configured to perform operations to sum the bit strings stored in the internal registers 226-1 to 226-N and/or in the external register 270. For example, if each of the MAC units 225-1 to 225-N are performing respective sub-operations as part of performance of a larger recursive operation, the adder circuit 234 can receive a final result of each of the respective sub-operations of the recursive operation and perform an operation to sum the final result of each of the respective sub-operations.

The control circuitry 220 can allocate a plurality of locations in the memory array 230, the sensing circuitry 250, and/or the external register 270 to store bank commands, application instructions (e.g., for sequences of operations), and arguments (e.g., processing in memory (PIM) commands) for various memory banks of the memory array 230. As used herein, "PIM commands" are commands executed by processing elements within a memory bank of a memory device (e.g., the memory device 104 illustrated in FIG. 1) via the sensing circuitry 250, as opposed to normal DRAM commands (e.g., read/write commands) that result in data being operated on by an external processing component such as the host 102 illustrated in FIG. 1. Accordingly, PIM commands can correspond to commands to perform operations within the memory array 230 without encumbering the host.

In some embodiments, the PIM commands can be executed within the memory device to perform logical operations using bit strings stored in the memory array 230, the sensing component 250, and/or the external register 270. The bit strings stored in the memory array 230, the sensing component 250, and/or the external register 270 can correspond to results of the recursive operations performed using the logic circuitry 220, as described above.

In a non-limiting example, an apparatus can include the control circuitry 223, which can be coupled to the MAC units 225-1 to 225-N. Each of the MAC units 225-1 to 225-N can include a respective processing unit 222-1 to 222-N and a respective internal register 226-1 to 226-N. In some embodiments, the MAC units 225-1 to 225-N can perform, responsive to signaling received from the control circuitry 223, respective recursive operations using bit strings as operands and accumulate results of respective iterations of the respective recursive operations in the respective internal registers 226-1 to 226-N. For example, the MAC unit 225-1 can perform a recursive operation using bit strings as operands and accumulate results of iterations of the recursive operation in the internal register 226-1. In some embodiments, performance of the recursive operations can be facilitated by the respective processing units 222-1 to 222-N.

Continuing with this example, the control circuitry 223 can write the accumulated results of the respective recursive operations to a register (e.g., to the external register 270) external to the MAC units 225-1 to 225-N or cause the accumulated results of the respective recursive operations to be transferred to an adder circuit 234 external to the MAC units 225-1 to 225-N based, at least in part, on characteristics of the accumulated results of the respective recursive operations. The characteristics can include whether the accumulated results represent a final result of the respective recursive operations and/or whether that, for a subsequent iteration of the respective recursive operations, a quantity of bits stored in the respective register will be greater than a quantity of bits allocated to the respective registers. Further, as described above, in some embodiments, the register external to the MAC units 225-1 to 225-N can include a greater quantity of storage locations than the respective internal registers 226-1 to 226-N.

In some embodiments, the control circuitry 234 can determine, that, for a subsequent iteration of the recursive operation, a quantity of bits stored in the respective internal registers 226-1 to 226-N will be greater than a quantity of bits allocated to the respective internal registers 226-1 to 226-N and write the accumulated results of the respective recursive operations to the register external to the MAC units 225-1 to 225-N based, at least in part, on the determination.

The control circuitry 223 can, in some embodiments, determine that the respective recursive operations are complete and cause the accumulated results of the respective recursive operations to be transferred to the adder circuit 234 based, at least in part, on the determination. The control circuitry 223 can then cause the adder circuit 234 to perform an operation to sum the accumulated results of the respective recursive operations, as described above. In some embodiments, the control circuitry 223 can then cause a result of the summation of the accumulated results of the respective recursive operations to be written to the register external to the MAC units 225-1 to 225-N.

The control circuitry 223 can, in some embodiments, control operation of a multiplexer 228 coupled to the MAC units 225-1 to 225-N to write the accumulated results of the respective recursive operations to the register external to the MAC units 225-1 to 225-N or cause the accumulated results of the respective recursive operations to be transferred to the adder circuit 234.

In another non-limiting example, a system can include logic circuitry 220 that includes control circuitry 223 coupled to a plurality of multiplier-accumulate (MAC) units 225-1 to 225-N that each comprise a respective processing unit 222-1 to 222-N and a respective internal register 226-1 to 226-N. A memory array 230 can be coupled to the logic circuitry 220. A plurality of sense amplifiers configured as an external register 270 can be located in a periphery region of the memory array 230 and can be communicatively coupled to the memory array 230.

In some embodiments, a logical operation can be performed using data stored in the memory array 230, the sensing circuitry 250, and/or the external register 270. For example, if the control circuitry 220 causes data to be transferred to the memory array 230, the sensing circuitry 250, and/or the external register 270, the memory array 230, the sensing circuitry 250, and/or the external register 270 can perform a logical operation using the data stored therein as described in connection with FIG. 6, herein.

Continuing with this example, the control circuitry 220 can cause performance of respective first iterations of recursive operations by each respective processing unit 222-1 to 222-N using bit strings as operands and control writing of a result of the respective first iteration to the respective internal registers 226-1 to 226-N of respective MAC units 225-1 to 225-N among the plurality of MAC units 225-1 to 225-N. For example, the control circuitry 220 can cause a first iteration of a recursive operation to be performed by a first processing unit 222-1 of a first MAC unit 225-1. The control circuitry 220 can cause the result of the first iteration of the recursive operation to be written to a first internal register 226-1 of the first MAC unit 225-1. Similar operations can be controlled by the control circuitry 220 for each MAC unit 225-1 to 225-N among the plurality of MAC units 225-1 to 225-N.

The control circuitry 220 can further cause performance of a respective second iteration of the recursive operations by each respective processing unit 222-1 to 222-N using bit strings as operands and accumulate the result of the respective second iteration within the respective internal registers 226-1 to 226-N of the respective MAC units among the plurality of MAC units 225-1 to 225-N.

In some embodiments, the control circuitry 220 can determine whether to perform a subsequent iteration of the recursive operations and control operation of a multiplexer 228 coupling the control circuitry to the memory device to cause the accumulated result stored in the respective internal registers 226-1 to 226-N to be transferred to the external register 270 in response to a determination that the subsequent iteration of the recursive operation is not to be performed. The control circuitry 220 can further control operation of the multiplexer 228 to cause the accumulated result stored in the respective internal registers 2226-1 to 226-N to be transferred to an adder circuit 234 coupled to the logic circuitry 220 in response to a determination that the accumulated results stored in the respective internal registers 226-1 to 226-N are to be summed together. The control circuitry 220 can the cause performance of an operation to sum the accumulated results stored in the respective internal registers 226-1 to 226-N. In some embodiments, the control circuitry 220 can cause a result of the sum of the accumulated results stored in the respective internal registers 226-1 to 226-N to be written to the external register 270.

In some embodiments, the system can further include a communication path 232 coupling the respective internal registers 226-1 to 226-N to the memory array 230. The control circuitry 220 can cause each accumulated result stored in the respective internal registers 226-1 to 226-N to be transferred to the external register 270 sequentially. For example, the communication path 232 can be configured to transfer 256-bits of data per burst. Therefore, in embodiments in which the internal registers 226-1 to 226-N can store up to 256-bits of data, the data can be transferred from each internal register 226-1 to 226-N in 256-bit bursts via the communication path 232. Embodiments are not so limited, however, and the communication path 232 can be configured to greater than 256-bits or less than 256-bits.

As described above, the control circuitry 220 can be configured to, prior to causing performance of the recursive operations, perform an operation to format the bit strings in a universal number or posit format. This can allow for a greater precision and/or accuracy to be maintained for the bit strings during performance of the recursive operations for a fixed bit width.

Figure 3:
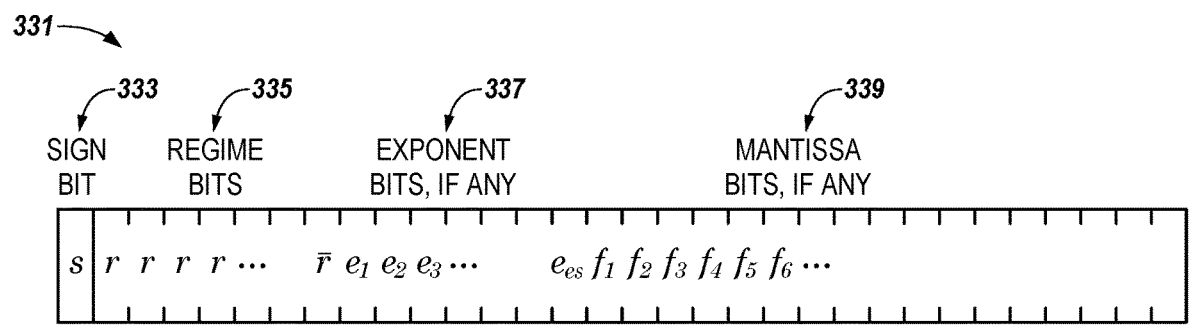
FIG. 3 is an example of an n-bit post with es exponent bits.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a first bit sub-set or a sign bit sub-set 333), a set of regime bits (e.g., a second bit sub-set or the regime bit sub-set 335), a set of exponent bits (e.g., a third bit sub-set or an exponent bit sub-set 337), and a set of mantissa bits (e.g., a fourth bit sub-set or a mantissa bit sub-set 339). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| Binary | 0000 | 0001 | 001X | 01XX | 10XX | 110X | 1110 | 1111 |
|---|---|---|---|---|---|---|---|---|
| Numerical (k) | −4 | −3 | −2 | −1 | 0 | 1 | 2 | 3 |

In FIG. 3, the regime bits 335 r correspond to identical bits in the bit string, while the regime bits 335 $\bar{r}$ correspond to an opposite bit that terminates the bit string. For example, for the numerical k value −2 shown in Table 1, the regime bits r correspond to the first two leading zeros, while the regime bit(s) $\bar{r}$ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of useed$^k$, where useed=$2^{2^{es}}$. Several example values for used are shown below in Table 2.

TABLE 2

| es | 0 | 1 | 2 | 3 | 4 |
|---|---|---|---|---|---|
| used | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$. As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction f, which can be analogous to the fraction 1.f, where f includes one or more bits to the right of the decimal point following the one. In contrast to floating-point bit strings, however, in the n-bit posit 331 shown in FIG. 3, the "hidden bit" (e.g., the one) may always be one (e.g., unity), whereas floating-point bit strings may include a subnormal number with a "hidden bit" of zero (e.g., 0.f).

As described herein, alter a numerical value or a quantity of bits of one of more of the sign 333 bit sub-set, the regime 335 bit sub-set, the exponent 337 bit sub-set, or the mantissa 339 bit sub-set can vary the precision of the n-bit posit 331. For example, changing the total number of bits in the n-bit posit 331 can alter the resolution of the n-bit posit bit string 331. That is, an 8-bit posit can be converted to a 16-bit posit by, for example, increasing the numerical values and/or the quantity of bits associated with one or more of the posit bit string's constituent bit sub-sets to increase the resolution of the posit bit string. Conversely, the resolution of a posit bit string can be decreased for example, from a 64-bit resolution to a 32-bit resolution by decreasing the numerical values and/or the quantity of bits associated with one or more of the posit bit string's constituent bit sub-sets.

In some embodiments, altering the numerical value and/or the quantity of bits associated with one or more of the regime 335 bit sub-set, the exponent 337 bit sub-set, and/or the mantissa 339 bit sub-set to vary the precision of the n-bit posit 331 can lead to an alteration to at least one of the other of the regime 335 bit sub-set, the exponent 337 bit sub-set, and/or the mantissa 339 bit sub-set. For example, when altering the precision of the n-bit posit 331 to increase the resolution of the n-bit posit bit string 331 (e.g., when performing an "up-convert" operation to increase the bit width of the n-bit posit bit string 331), the numerical value and/or the quantity of bits associated with one or more of the regime 335 bit sub-set, the exponent 337 bit sub-set, and/or the mantissa 339 bit sub-set may be altered.

In a non-limiting example in which the resolution of the n-bit posit bit string 331 is increased (e.g., the precision of the n-bit posit bit string 331 is varied to increase the bit width of the n-bit posit bit string 331) but the numerical value or the quantity of bits associated with the exponent 337 bit sub-set does not change, the numerical value or the quantity of bits associated with the mantissa 339 bit sub-set may be increased. In at least one embodiment, increasing the numerical value and/or the quantity of bits of the mantissa 339 bit sub-set when the exponent 338 bit sub-set remains unchanged can include adding one or more zero bits to the mantissa 339 bit sub-set.

In another non-limiting example in which the resolution of the n-bit posit bit string 331 is increased (e.g., the precision of the n-bit posit bit string 331 is varied to increase the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In another example in which the resolution of the n-bit posit bit string 331 is increased (e.g., the precision of the n-bit posit bit string 331 is varied to increase the bit width of the n-bit posit bit string 331), the numerical value and/or the quantity of bits associated with the exponent 335 bit sub-set may be increased and the numerical value and/or the quantity of bits associated with the regime 333 bit sub-set may be decreased. Conversely, in some embodiments, the numerical value and/or the quantity of bits associated with the exponent 335 bit sub-set may be decreased and the numerical value and/or the quantity of bits associated with the regime 333 bit sub-set may be increased.

In a non-limiting example in which the resolution of the n-bit posit bit string 331 is decreased (e.g., the precision of the n-bit posit bit string 331 is varied to decrease the bit width of the n-bit posit bit string 331) but the numerical value or the quantity of bits associated with the exponent 337 bit sub-set does not change, the numerical value or the quantity of bits associated with the mantissa 339 bit sub-set may be decreased. In at least one embodiment, decreasing the numerical value and/or the quantity of bits of the mantissa 339 bit sub-set when the exponent 338 bit sub-set remains unchanged can include truncating the numerical value and/or the quantity of bits associated with the mantissa 339 bit sub-set.

In another non-limiting example in which the resolution of the n-bit posit bit string 331 is decreased (e.g., the precision of the n-bit posit bit string 331 is varied to decrease the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In some embodiments, changing the numerical value and/or a quantity of bits in the exponent bit sub-set can alter the dynamic range of the n-bit posit 331. For example, a 32-bit posit bit string with an exponent bit sub-set having a numerical value of zero (e.g., a 32-bit posit bit string with es=0, or a (32,0) posit bit string) can have a dynamic range of approximately 18 decades. However, a 32-bit posit bit string with an exponent bit sub-set having a numerical value of 3 (e.g., a 32-bit posit bit string with es=3, or a (32,3) posit bit string) can have a dynamic range of approximately 145 decades.

Figure 4A:
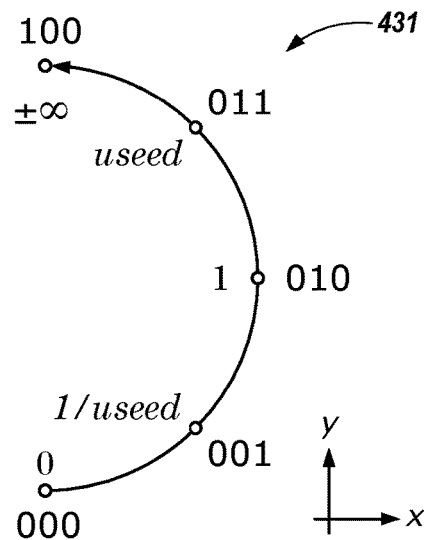
FIG. 4A is an example of positive values for a 3-bit posit.

FIG. 4A is an example of positive values for a 3-bit posit. In FIG. 4A, only the right half of projective real numbers, however, it will be appreciated that negative projective real numbers that correspond to their positive counterparts shown in FIG. 4A can exist on a curve representing a transformation about the y-axis of the curves shown in FIG. 4A.

Figure 4B:
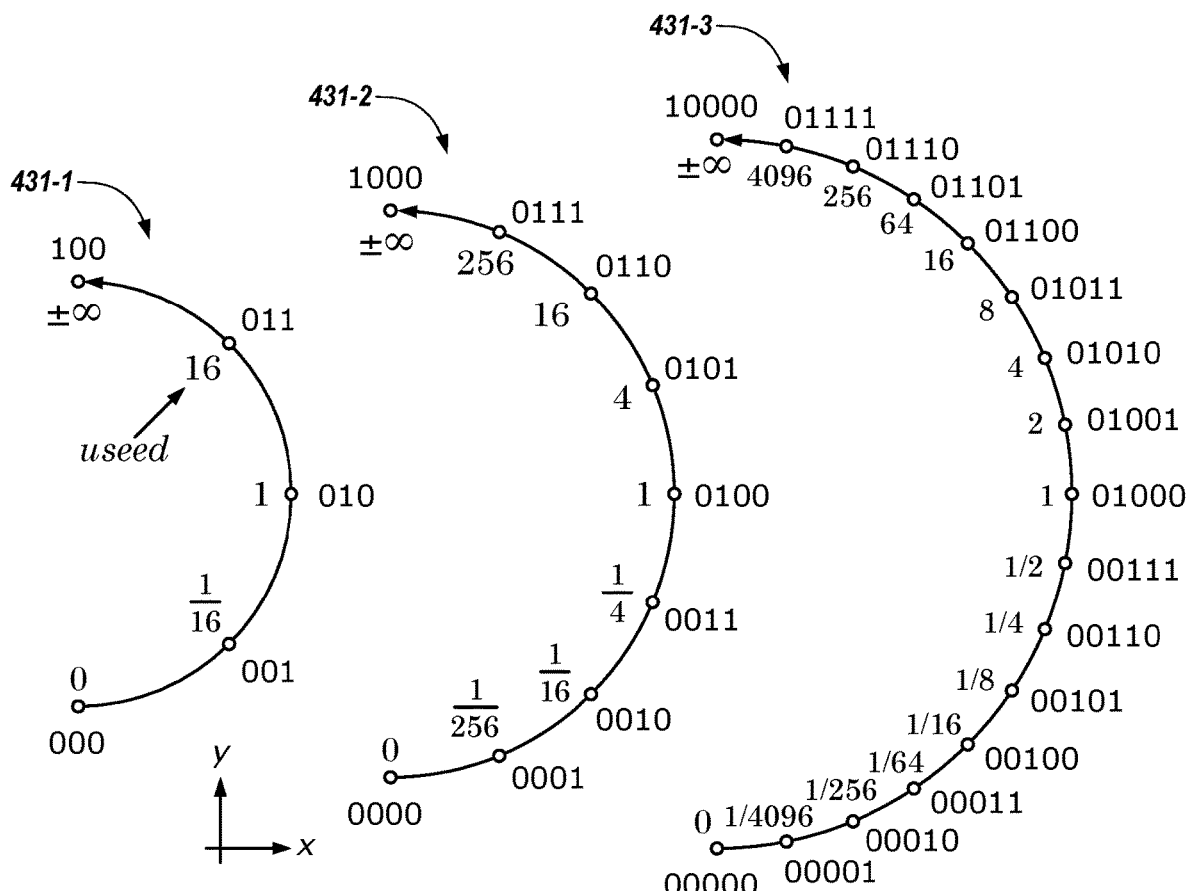
FIG. 4B is an example of posit construction using two exponent bits.

In the example of FIG. 4A, es=2, so useed=$2^{2^{es}}$=16. The precision of a posit 431-1 can be increased by appending bits the bit string, as shown in FIG. 4B. For example, appending a bit with a value of one (1) to bit strings of the posit 431-1 increases the accuracy of the posit 431-1 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

If maxpos is the largest positive value of a bit string of the posits 431-1, 431-2, 431-3 and minpos is the smallest value of a bit string of the posits 431-1, 431-2, 431-3, maxpos may be equivalent to useed and minpos may be equivalent to $$\frac{1}{useed}.$$

Between maxpos and ±∞, a new bit value may be maxpos*useed, and between zero and minpos, a new bit value may be $$\frac{minpos}{useed}.$$

These new bit values can correspond to a new regime bit 335. Between existing values x=$2^m$ and y=$2^n$, where m and n differ by more than one, the new bit value may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean $$\frac{x+y}{2},$$

which corresponds to a new mantissa bit 339.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about the y-axis of the curves shown in FIG. 4B. The posits 431-1, 431-2, 431-3 shown in FIG. 4B each include only two exception values: Zero (0) when all the bits of the bit string are zero and ±∞ when the bit string is a one (1) followed by all zeros. It is noted that the numerical values of the posits 431-1, 431-2, 431-3 shown in FIG. 4 are exactly $useed^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so useed=$2^{2^{es}}$=16, the posit 431-2 has es=3, so useed=$2^{2^{es}}$=256, and the posit 431-3 has es=4, so useed=$2^{2^{es}}$=4096.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit (r̄) appended thereto. As described above, between existing values, the corresponding bit strings have an additional exponent bit appended thereto. For example, the numerical values $\frac{1}{16}$, $\frac{1}{4}$, 1, and 4 will have an exponent bit appended thereto. That is, the final one corresponding to the numerical value 4 is an exponent bit, the final zero corresponding to the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between ¹⁄₁₆ and 16.

A non-limiting example of decoding a posit (e.g., a posit 431) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as $\{f_1 f_2 \ldots f_{fs}\}$ and f is a value represented by $1. f_1 f_2 \ldots f_{fs}$ (e.g., by a one followed by a decimal point followed by the mantissa bits 339), the p can be given by Equation 2, below.

$$x = \begin{cases} 0, & p = 0 \\ \pm \infty, & p = -2^{n-1} \\ \text{sign}(p) \times useed^k \times 2^e \times f, & \text{all other } p \end{cases} \quad \text{Equation 2}$$

A further illustrative example of decoding a posit bit string is provided below in connection with the posit bit string 0000110111011101 shown in Table 3, below follows.

TABLE 3

| SIGN | REGIME | EXPONENT | MANTISSA |
|------|--------|----------|----------|
| 0    | 0001   | 101      | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is $256^{-3}$ (e.g., $useed^k$). The exponent bits 337 represent five (5) as an unsigned integer and therefore contribute an additional scale factor of $2^e = 2^5 = 32$. Lastly, the mantissa bits 339, which are given in Table 3 as 11011101, represent two-hundred and twenty-one (221) as an unsigned integer, so the mantissa bits 339, given above as f are $$f + \frac{221}{256}.$$

Using these values and Equation 1, the numerical value corresponding to the posit bit string given in Table 3 is $$+256^{-3} \times 2^5 \times \left(1 + \frac{221}{256}\right) = \frac{437}{134217728} \approx 3.55393 \times 10^{-6}.$$

Figure 5:
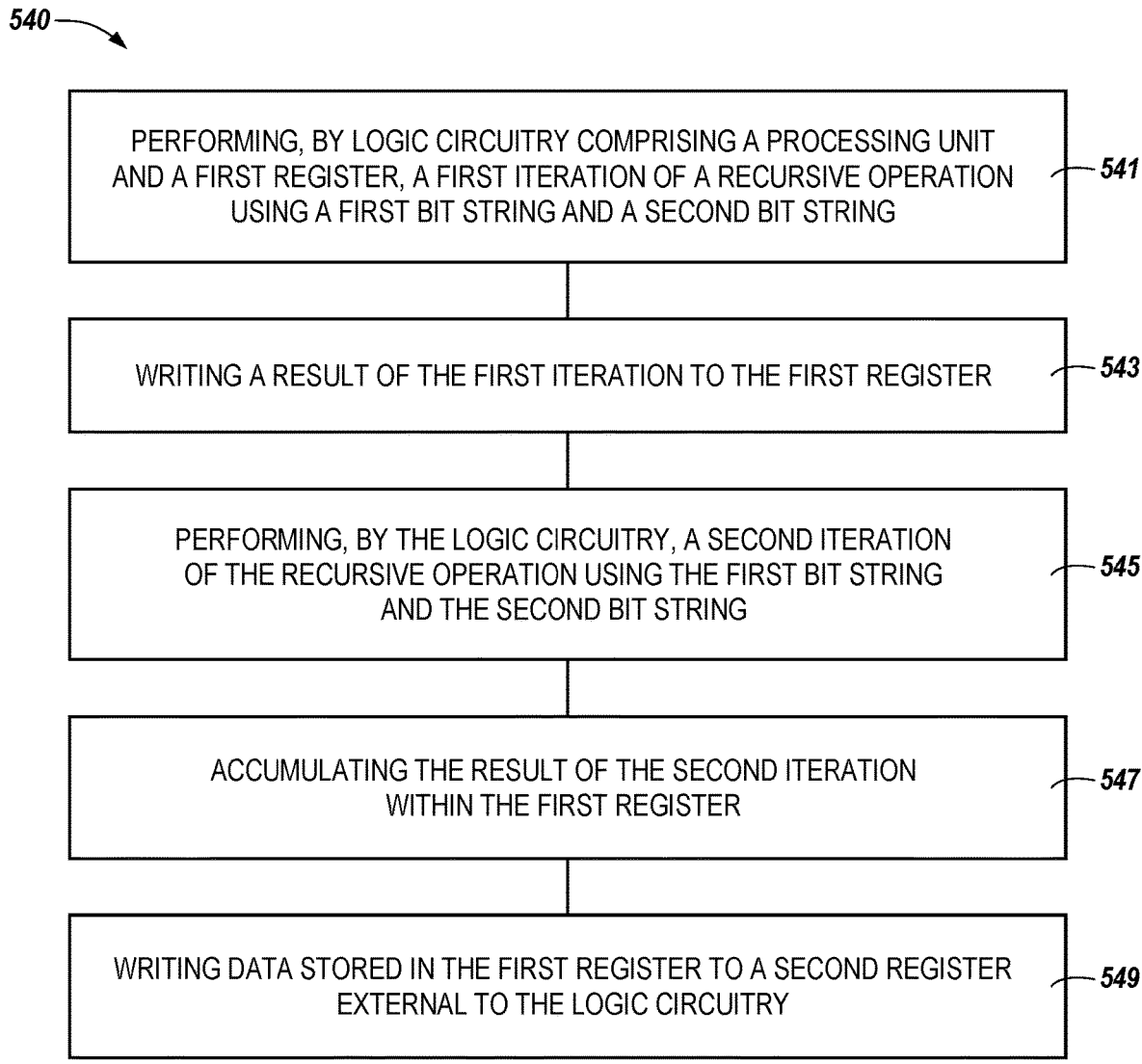
FIG. 5 is a flow diagram representing an example method corresponding to bit string accumulation in multiple registers in accordance with a number of embodiments of the present disclosure.

FIG. 5 is a flow diagram representing an example method 540 corresponding to a bit string accumulation in multiple registers in accordance with a number of embodiments of the present disclosure. The method 540 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 541, the method 540 can include performing, by logic circuitry comprising a processing unit and a first register, a first iteration of a recursive operation using a first bit string and a second bit string. The logic circuitry can be analogous to the logic circuitry 120 and 220 illustrated in FIGS. 1 and 2, while the processing unit can be analogous to the processing unit 122 and the processing units 222-1 to 222-N illustrated in FIGS. 1 and 2. In some embodiments, the first register can be analogous to the internal register 126 and the internal registers 226-1 to 226-N illustrated in FIGS. 1 and 2, herein.

At block 543, the method 540 can include writing a result of the first iteration to the first register. For example, if the recursive operation is a multiplier-accumulate (MAC) operation, the method 540 can include performing successive multiplication operations and, after each successive multiplication is complete, writing the result of the multiplication operation to the first register.

At block 545, the method 540 can include performing, by the logic circuitry, a second iteration of the recursive operation using the first bit string and the second bit string. For example, if the recursive operation is a MAC operation, the method 540 can include performing successive multiplication operations and, after each successive multiplication is complete, writing the result of each successive multiplication operation to the first register.

At block 547, the method 540 can include accumulating the result of the second iteration within the first register. For example, each successive result of the MAC operation can be summed with the value currently stored by the second register. Embodiments are not so limited, however, and in some embodiments each successive result of a MAC operation can overwrite a previous result stored in the first register.

At block 549, the method 540 can include writing data stored in the first register to a second register external to the logic circuitry. The second register can be analogous to the external register 170 or the external register 270 illustrated in FIGS. 1 and 2, herein. In some embodiments, the method 540 can include writing the data stored in the first register to the second register via a dedicated bus, such as the communication path 232 illustrated in FIG. 2, coupling the logic circuitry to the second register. Once the data is written to the second register, the method 540 can include writing data stored in the second register to an array of memory cells, such as the memory array 130 and the memory array 230 and/or the sensing circuitry 150 and the sensing circuitry 250 illustrated in FIGS. 1 and 2, coupled to the second register.

In some embodiments, the method 540 can include writing data stored in the second register to a memory array coupled to the second register and performing, within the memory device, a logic operation using the data written to the memory array as an operand for the logic operation. For example, once the data stored in the second register is written to the memory array, the memory array and/or the sensing circuitry can be operated as described in connection with FIG. 6, herein, to perform one or more logical operations using the data. In some embodiments, the memory array and/or the sensing circuitry can perform such logical operations internally (e.g., without transferring operands used for the logical operations to circuitry external to the memory array, the sensing circuitry, and/or the second register).

The method 540 can further include determining that, for a subsequent iteration of the recursive operation, a quantity of bits stored in the first register will be greater than a quantity of bits allocated to the first register and/or writing data stored in the first register to a second register based, at least in part, on the determination. For example, because the size of the accumulated result stored in the first register can become larger with each successive iteration of the recursive operation, there can be a point in time when the first register will overrun if a result of a subsequent iteration is accumulated in the first register. In order to avoid this scenario while preserving the accuracy and/or precision of the accumulated result, the method 540 can include writing the accumulated result stored in the first register to the second register, which may include a greater quantity of storage locations than the first register.

In some embodiments, the method 540 can include determining that the recursive operation is complete and writing data stored in the first register to a second register based, at least in part, on the determination. In such embodiments, the method 540 can further include performing, by the logic circuitry, an iteration of a different recursive operation using a third bit string and a fourth bit string in response to the data stored in the first register being written to the second register and writing a result of the iteration of the different recursive operation to the first register.

Embodiments are not so limited, however, and in some embodiments, the method 540 can include writing at least one result of an iteration of the recursive operation to the second register and accumulating results of subsequent iterations in the first register and/or the second register.

Figure 6:
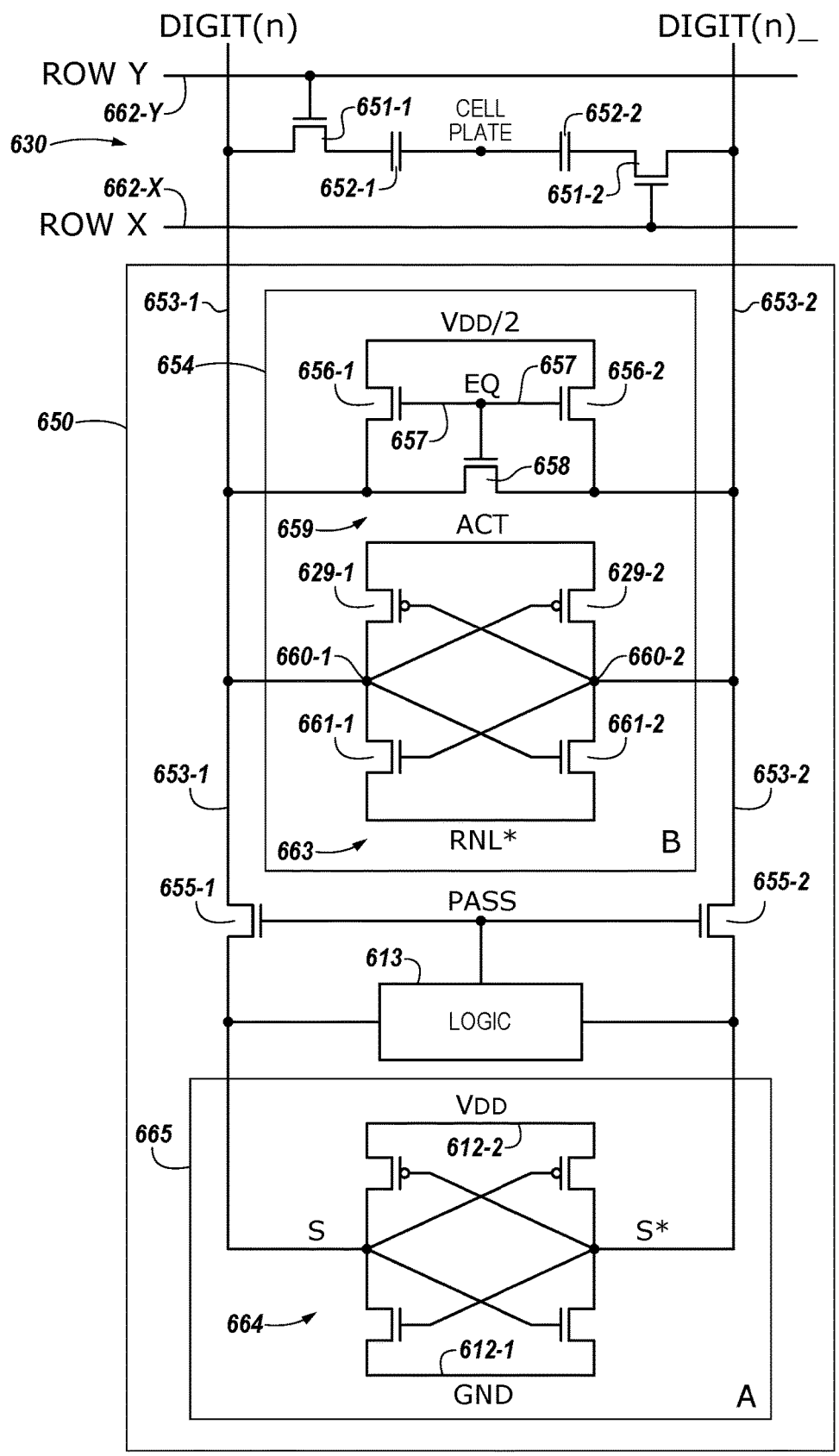
FIG. 6 is a schematic diagram illustrating a portion of a memory array including sensing circuitry in accordance with a number of embodiments of the present disclosure.

FIG. 6 is a schematic diagram illustrating a portion of a memory array including sensing circuitry in accordance with a number of embodiments of the present disclosure. The sensing component 650 represents one of a number of sensing components that can correspond to sensing circuitry 150 shown in FIG. 1.

In the example shown in FIG. 6, the memory array 630 is a DRAM array of 1T1C (one transistor one capacitor) memory cells in which a transistor serves as the access device and a capacitor serves as the storage element; although other embodiments of configurations can be used (e.g., 2T2C with two transistors and two capacitors per memory cell). In this example, a first memory cell comprises transistor 651-1 and capacitor 652-1, and a second memory cell comprises transistor 651-2 and capacitor 652-2, etc. In a number of embodiments, the memory cells may be destructive read memory cells (e.g., reading the data stored in the cell destroys the data such that the data originally stored in the cell is refreshed after being read).

The cells of the memory array 630 can be arranged in rows coupled by access lines 662-X (Row X), 662-Y (Row Y), etc., and columns coupled by pairs of complementary sense lines (e.g., digit lines 653-1 labelled DIGIT(n) and 653-2 labelled DIGIT(n)_in FIG. 6). Although only one pair of complementary digit lines are shown in FIG. 6, embodiments of the present disclosure are not so limited, and an array of memory cells can include additional columns of memory cells and digit lines (e.g., 4,096, 8,192, 16,384, etc.).

Memory cells can be coupled to different digit lines and word lines. For instance, in this example, a first source/drain region of transistor 651-1 is coupled to digit line 653-1, a second source/drain region of transistor 651-1 is coupled to capacitor 652-1, and a gate of transistor 651-1 is coupled to word line 662-Y. A first source/drain region of transistor 651-2 is coupled to digit line 653-2, a second source/drain region of transistor 651-2 is coupled to capacitor 652-2, and a gate of transistor 651-2 is coupled to word line 662-X. A cell plate, as shown in FIG. 6, can be coupled to each of capacitors 652-1 and 652-2. The cell plate can be a common node to which a reference voltage (e.g., ground) can be applied in various memory array configurations.

The digit lines 653-1 and 653-2 of memory array 630 are coupled to sensing component 650 in accordance with a number of embodiments of the present disclosure. In this example, the sensing component 650 comprises a sense amplifier 654 and a compute component 665 corresponding to a respective column of memory cells (e.g., coupled to a respective pair of complementary digit lines). The sense amplifier 654 is coupled to the pair of complementary digit lines 653-1 and 653-2. The compute component 665 is coupled to the sense amplifier 654 via pass gates 655-1 and 655-2. The gates of the pass gates 655-1 and 655-2 can be coupled to selection logic 613.

The selection logic 613 can include pass gate logic for controlling pass gates that couple the pair of complementary digit lines un-transposed between the sense amplifier 654 and the compute component 665 and swap gate logic for controlling swap gates that couple the pair of complementary digit lines transposed between the sense amplifier 654 and the compute component 665. The selection logic 613 can be coupled to the pair of complementary digit lines 653-1 and 653-2 and configured to perform logical operations on data stored in array 630. For instance, the selection logic 613 can be configured to control continuity of (e.g., turn on/turn off) pass gates 655-1 and 655-2 based on a selected logical operation that is being performed.

The sense amplifier 654 can be operated to determine a data value (e.g., logic state) stored in a selected memory cell. The sense amplifier 654 can comprise a cross coupled latch 615 (e.g., gates of a pair of transistors, such as n-channel transistors 661-1 and 661-2 are cross coupled with the gates of another pair of transistors, such as p-channel transistors 629-1 and 629-2), which can be referred to herein as a primary latch. However, embodiments are not limited to this example.

In operation, when a memory cell is being sensed (e.g., read), the voltage on one of the digit lines 653-1 or 653-2 will be slightly greater than the voltage on the other one of digit lines 653-1 or 653-2. An ACT signal and an RNL* signal can be driven low to enable (e.g., fire) the sense amplifier 654. The digit line 653-1 or 653-2 having the lower voltage will turn on one of the transistors 629-1 or 629-2 to a greater extent than the other of transistors 629-1 or 629-2, thereby driving high the digit line 654-1 or 654-2 having the higher voltage to a greater extent than the other digit line 654-1 or 654-2 is driven high.

Similarly, the digit line 654-1 or 654-2 having the higher voltage will turn on one of the transistors 661-1 or 661-2 to a greater extent than the other of the transistors 661-1 or 661-2, thereby driving low the digit line 654-1 or 654-2 having the lower voltage to a greater extent than the other digit line 654-1 or 654-2 is driven low. As a result, after a short delay, the digit line 654-1 or 654-2 having the slightly greater voltage is driven to the voltage of the supply voltage $V_{CC}$ through a source transistor, and the other digit line 654-1 or 654-2 is driven to the voltage of the reference voltage (e.g., ground) through a sink transistor. Therefore, the cross coupled transistors 661-1 and 661-2 and transistors 629-1 and 629-2 serve as a sense amplifier pair, which amplify the differential voltage on the digit lines 654-1 and 654-2 and operate to latch a data value sensed from the selected memory cell.

Embodiments are not limited to the sensing component configuration illustrated in FIG. 6. As an example, the sense amplifier 654 can be a current-mode sense amplifier and/or a single-ended sense amplifier (e.g., sense amplifier coupled to one digit line). Also, embodiments of the present disclosure are not limited to a folded digit line architecture such as that shown in FIG. 6.

The sensing component 650 can be one of a plurality of sensing components selectively coupled to a shared I/O line. As such, the sensing component 650 can be used in association with reversing data stored in memory in accordance with a number of embodiments of the present disclosure.

In this example, the sense amplifier 654 includes equilibration circuitry 659, which can be configured to equilibrate the digit lines 654-1 and 654-2. The equilibration circuitry 659 comprises a transistor 658 coupled between digit lines 654-1 and 654-2. The equilibration circuitry 659 also comprises transistors 656-1 and 656-2 each having a first source/drain region coupled to an equilibration voltage (e.g., $V_{DD}/2$), where $V_{DD}$ is a supply voltage associated with the array. A second source/drain region of transistor 656-1 is coupled to digit line 654-1, and a second source/drain region of transistor 656-2 is coupled to digit line 654-2. Gates of transistors 658, 656-1, and 656-2 can be coupled together and to an equilibration (EQ) control signal line 657. As such, activating EQ enables the transistors 658, 656-1, and 656-2, which effectively shorts digit lines 654-1 and 654-2 together and to the equilibration voltage (e.g., $V_{DD}/2$). Although FIG. 6 shows sense amplifier 654 comprising the equilibration circuitry 659, embodiments are not so limited, and the equilibration circuitry 659 may be implemented discretely from the sense amplifier 654, implemented in a different configuration than that shown in FIG. 6, or not implemented at all.

As shown in FIG. 6, the compute component 665 can also comprise a latch, which can be referred to herein as a secondary latch 664. The secondary latch 664 can be configured and operated in a manner similar to that described above with respect to the primary latch 663, with the exception that the pair of cross coupled p-channel transistors (e.g., PMOS transistors) included in the secondary latch can have their respective sources coupled to a supply voltage 612-2 (e.g., $V_{DD}$), and the pair of cross coupled n-channel transistors (e.g., NMOS transistors) of the secondary latch can have their respective sources selectively coupled to a reference voltage 612-1 (e.g., ground), such that the secondary latch is continuously enabled. The configuration of the compute component 665 is not limited to that shown in FIG. 6, and various other embodiments are feasible.

In some embodiments, the sensing circuitry 650 can be operated as described above in connection with performance of one or more logical operations using resultant bit strings that represent the results of one or more recursive operations, as described above. For example, data that results from performance of one or more recursive operations can be used as operands for performance of logical operations within memory array 630 and/or the sensing circuitry 650.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    performing, by logic circuitry comprising a processing unit and a first register, a first iteration of a recursive operation using a first bit string and a second bit string;
    writing a result of the first iteration to the first register;
    performing, by the logic circuitry, a second iteration of the recursive operation using the first bit string and the second bit string;
    accumulating the result of the second iteration within the first register;
    writing data stored in the first register to a second register external to the logic circuitry;
    determining that, for a subsequent iteration of the recursive operation, a quantity of bits stored in the first register will be greater than a quantity of bits allocated to the first register; and
    writing data stored in the first register to the second register based, at least in part, on the determination.

2. The method of claim 1, further comprising:
    determining that the recursive operation is complete;
    writing data stored in the first register to the second register based, at least in part, on the determination;
    performing, by the logic circuitry, an iteration of a different recursive operation using a third bit string and a fourth bit string in response to the data stored in the first register being written to the second register; and
    writing a result of the iteration of the different recursive operation to the first register.

3. The method of claim 1, further comprising writing the data stored in the first register to the second register via a dedicated bus coupling the logic circuitry to the second register.

4. The method of claim 1, further comprising writing data stored in the second register to an array of memory cells coupled to the second register.

5. An apparatus, comprising:
    control circuitry coupled to a plurality of multiplier-accumulate (MAC) units each comprising a respective processing unit and a respective internal register, wherein the MAC units are to:

perform, responsive to signaling received from the control circuitry, respective recursive operations using bit strings as operands; and accumulate results of respective iterations of the respective recursive operations in the respective internal registers, and wherein the control circuitry is to:

write the accumulated results of the respective recursive operations to a register external to the MAC units or cause the accumulated results of the respective recursive operations to be transferred to an adder circuit external to the MAC units based, at least in part, on characteristics of the accumulated results of the respective recursive operations;

determine, that, for a subsequent iteration of the recursive operation, a quantity of bits stored in the respective internal registers will be greater than a quantity of bits allocated to the respective internal registers; and write the accumulated results of the respective recursive operations to the register external to the MAC units based, at least in part, on the determination.

6. The apparatus of claim 5, wherein the control circuitry is to:

determine that the respective recursive operations are complete;

cause the accumulated results of the respective recursive operations to be transferred to the adder circuit based, at least in part, on the determination; and cause the adder circuit to perform an operation to sum the accumulated results of the respective recursive operations.

7. The apparatus of claim 6, wherein the control circuitry is to cause a result of the summation of the accumulated results of the respective recursive operations to be written to the register external to the MAC units.

8. The apparatus of claim 5, wherein the control circuitry is to control operation of a multiplexer coupled to the MAC units to write the accumulated results of the respective recursive operations to the register external to the MAC units or cause the accumulated results of the respective recursive operations to be transferred to the adder circuit.

9. The apparatus of claim 5, wherein the characteristics of the accumulated results of the respective recursive operations include whether the accumulated results represent a final result of the respective recursive operations or whether that, for a subsequent iteration of the respective recursive operations, a quantity of bits stored in the respective register will be greater than a quantity of bits allocated to the respective registers, or both.

10. The apparatus of claim 5, wherein the register external to the MAC units comprises a greater quantity of storage locations than the respective internal registers.

11. A system, comprising:

logic circuitry comprising control circuitry coupled to a plurality of multiplier-accumulate (MAC) units each comprising a respective processing unit and a respective internal register;

a memory array coupled to the logic circuitry; and a plurality of sense amplifiers configured as an external register and located in a periphery region of the memory array and communicatively coupled to the memory array, wherein the control circuitry is to:

cause performance of respective first iterations of recursive operations by each respective processing unit using bit strings as operands;

control writing of a result of the respective first iteration to the respective internal registers of respective MAC units among the plurality of MAC units;

cause performance of a respective second iteration of the recursive operations by each respective processing unit using bit strings as operands;

accumulate the result of the respective second iteration within the respective internal registers of the respective MAC units among the plurality of MAC units;

determine whether to perform a subsequent iteration of the recursive operations; and control operation of a multiplexer coupling the control circuitry to the memory device to cause the accumulated result stored in the respective internal registers to be transferred to the external register in response to a determination that the subsequent iteration of the recursive operation is not to be performed.

12. The system of claim 11, wherein the control circuitry is to:

control operation of the multiplexer to cause the accumulated result stored in the respective internal registers to be transferred to an adder circuit coupled to the logic circuitry in response to a determination that the accumulated results stored in the respective internal registers are to be summed together; and cause performance of an operation to sum the accumulated results stored in the respective internal registers.

13. The system of claim 12, wherein the control circuitry is to cause a result of the sum of the accumulated results stored in the respective internal registers to be written to the external register.

14. The system of claim 11, further comprising a communication path coupling the respective internal registers to the memory array, wherein the control circuitry is to cause each accumulated result stored in the respective internal registers to be transferred to the external register sequentially.

15. The system of claim 11, wherein the control circuitry is to, prior to causing performance of the recursive operations, perform an operation to format the bit strings in a universal number or posit format.

16. The system of claim 11, wherein the external register comprises a greater quantity of storage locations than the respective internal registers.

17. An apparatus, comprising:

control circuitry coupled to a plurality of multiplier-accumulate (MAC) units each comprising a respective processing unit and a respective internal register, wherein the MAC units are to:

perform, responsive to signaling received from the control circuitry, respective recursive operations using bit strings as operands; and accumulate results of respective iterations of the respective recursive operations in the respective internal registers, and wherein the control circuitry is to control operation of a multiplexer coupled to the MAC units to:

write the accumulated results of the respective recursive operations to a register external to the MAC units or cause the accumulated results of the respective recursive operations to be transferred to an adder circuit external to the MAC units based, at least in part, on characteristics of the accumulated results of the respective recursive operations.

* * * * *